US010056234B2

(12) United States Patent
Seok et al.

(10) Patent No.: US 10,056,234 B2
(45) Date of Patent: Aug. 21, 2018

(54) PLASMA EQUIPMENT FOR TREATING POWDER

(71) Applicant: KOREA BASIC SCIENCE INSTITUTE, Daejeon (KR)

(72) Inventors: Dong Chan Seok, Daejeon (KR); Yong Ho Jung, Seoul (KR); Hyun Young Jeong, Gunsan-si (KR)

(73) Assignee: KOREA BASIC SCIENCE INSTITUTE, Daejeon (KR)

( * ) Notice: Subject to any disclaimer, the term of this patent is extended or adjusted under 35 U.S.C. 154(b) by 0 days.

(21) Appl. No.: 15/827,929

(22) Filed: Nov. 30, 2017

(65) Prior Publication Data

US 2018/0090302 A1    Mar. 29, 2018

Related U.S. Application Data

(62) Division of application No. 14/409,357, filed as application No. PCT/KR2013/011272 on Dec. 6, 2013.

(30) Foreign Application Priority Data

Dec. 10, 2012 (KR) ........................ 10-2012-0142763

(51) Int. Cl.
*B44C 1/22* (2006.01)
*C03C 15/00* (2006.01)
(Continued)

(52) U.S. Cl.
CPC ....... *H01J 37/32568* (2013.01); *B01J 19/088* (2013.01); *H01J 37/32348* (2013.01);
(Continued)

(58) Field of Classification Search
USPC ........................................... 216/67
See application file for complete search history.

(56) References Cited

U.S. PATENT DOCUMENTS

2008/0145553 A1\* 6/2008 Boulos ................... B01J 19/088
427/447

FOREIGN PATENT DOCUMENTS

JP    08-035070    2/1996
JP    2009-233482   10/2009
(Continued)

OTHER PUBLICATIONS

International Search Report and Written Opinion issued in International Patent Application No. PCT/KR2013/011272, dated Jan. 24, 2013.

*Primary Examiner* — Roberts P Culbert
(74) *Attorney, Agent, or Firm* — Norton Rose Fulbright US LLP

(57) ABSTRACT

A powder plasma processing apparatus is disclosed. The powder plasma processing apparatus includes: a chamber configured to perform plasma processing on a powder; a powder supply unit disposed in an upper portion of the chamber; and a plurality of plate-like surface discharge plasma modules disposed below the powder supply unit and positioned within the chamber, wherein surfaces of the surface discharge plasma modules are spaced apart from each other. According to the powder plasma processing apparatus, the powder can be uniformly processed, and the time that the powder spends in contact with the plasma can be controlled, thereby allowing efficient powder processing to be performed.

15 Claims, 3 Drawing Sheets

(51) Int. Cl.
    *C03C 25/68*     (2006.01)
    *C23F 1/00*     (2006.01)
    *H01J 37/32*     (2006.01)
    *H05H 1/48*     (2006.01)
    *B01J 19/08*     (2006.01)
    *H05H 1/24*     (2006.01)

(52) U.S. Cl.
    CPC ........ *H05H 1/48* (2013.01); *B01J 2219/0835* (2013.01); *B01J 2219/0879* (2013.01); *H05H 2001/2412* (2013.01)

(56) References Cited

FOREIGN PATENT DOCUMENTS

| | | |
|---|---|---|
| KR | 2001-0068436 | 7/2001 |
| KR | 10-1068551 | 9/2011 |

\* cited by examiner

[Fig. 1]
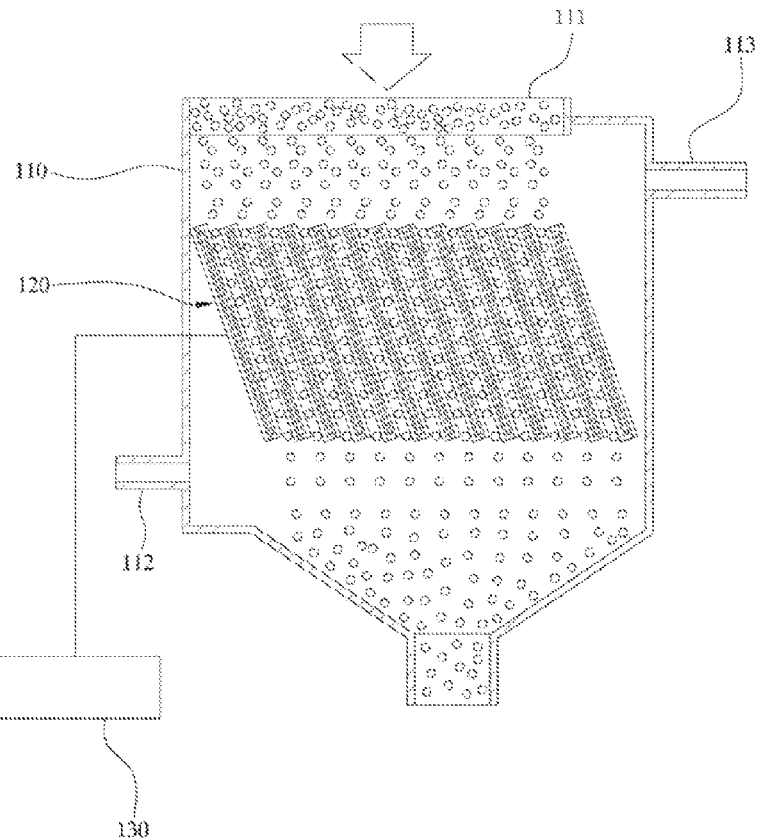
[Fig. 2]
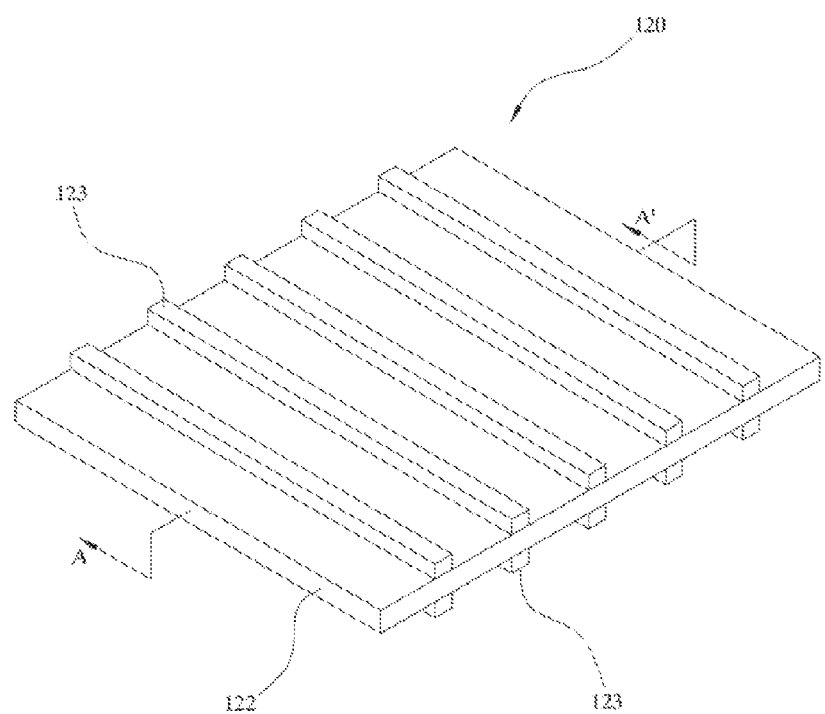

[Fig. 3]
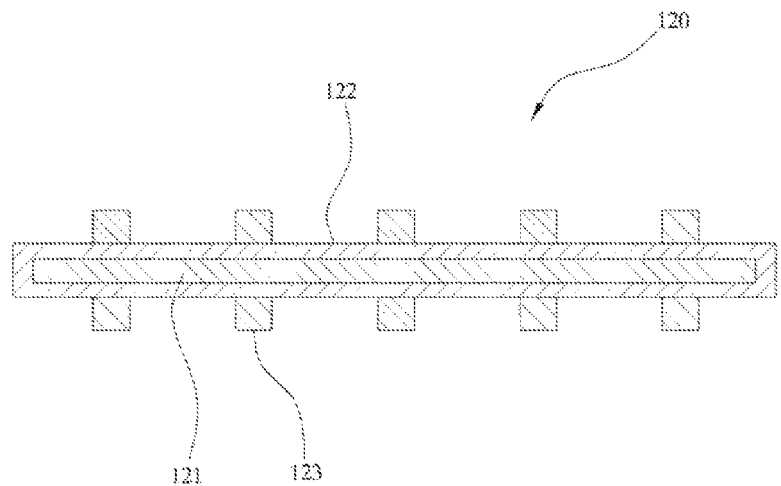
[Fig. 4]
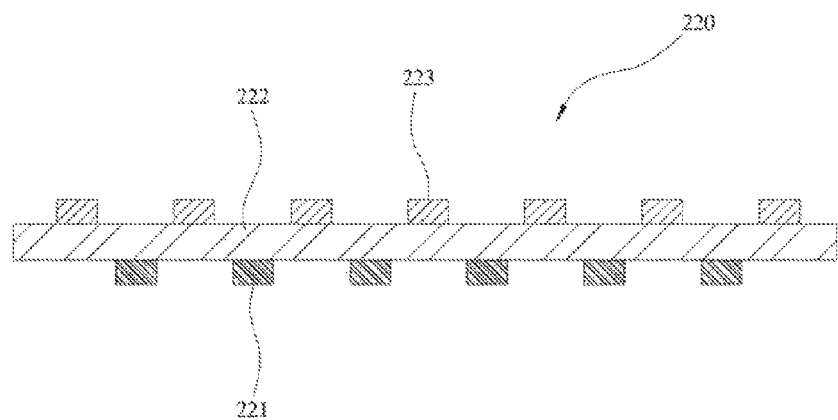
[Fig. 5]
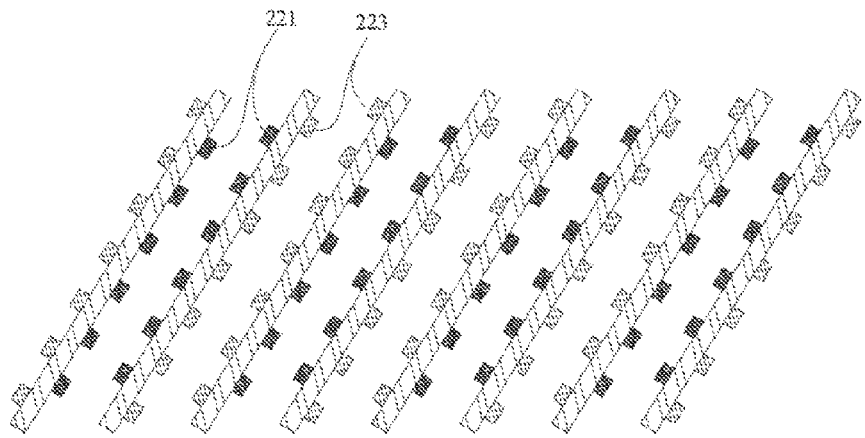

[Fig. 6a]
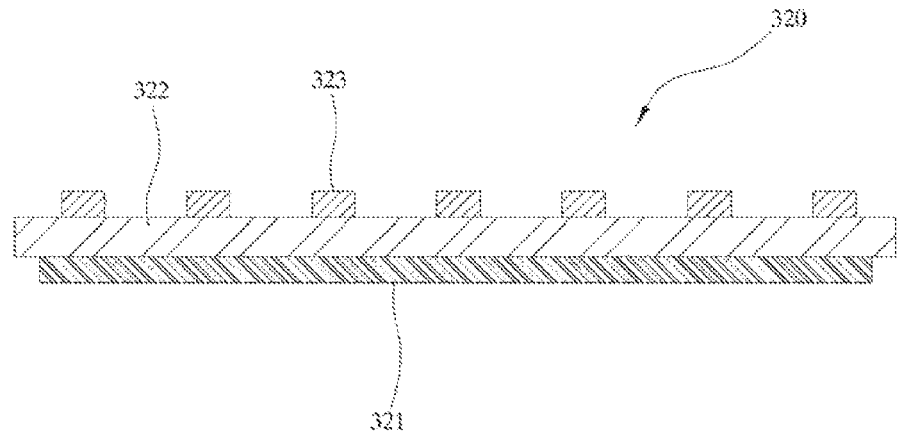
[Fig. 6b]
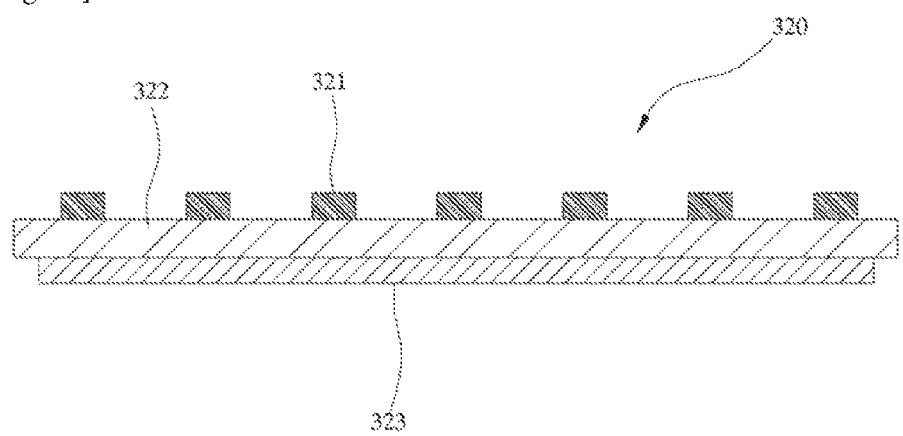
[Fig. 7]
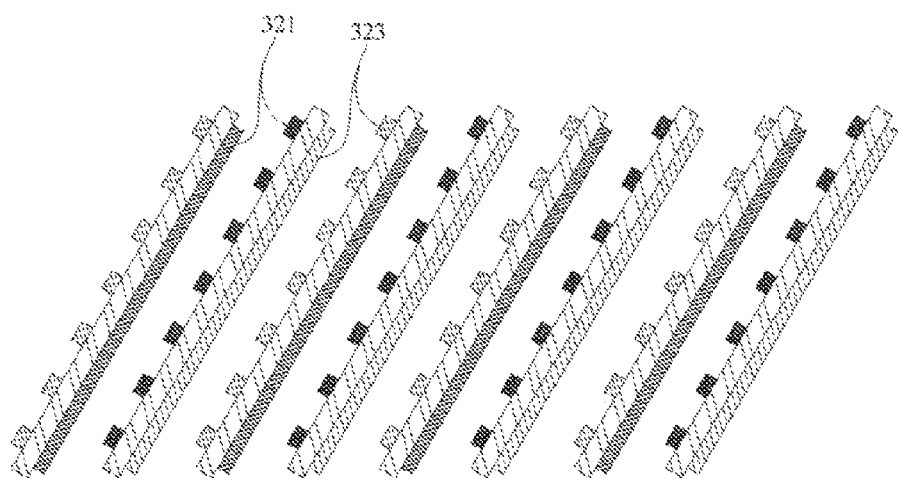

PLASMA EQUIPMENT FOR TREATING POWDER

CROSS-REFERENCED TO RELATED APPLICATION

This application is a divisional of U.S. patent application Ser. No. 14/409,357, filed Dec. 18, 2014, which is a national phase application under 35 U.S.C. § 371 of International Patent Application No. PCT/KR2013/011272 filed Dec. 6, 2013, which claims priority to Korean Patent Application No. 10-2012-0142763, filed Dec. 10, 2012. The entire contents of the referenced patent applications are incorporated into the present application by reference.

BACKGROUND

1. Field of the Invention

The present invention relates to a powder plasma processing apparatus, and more particularly, to a powder plasma processing apparatus that uniformly processes a powder using a surface discharge plasma module.

2. Discussion of Related Art

Plasma is an ionized gas. When a gas consisting of atoms or molecules is excited using energy, plasma consisting of electrons, decomposed gases, photons, and the like is generated. This plasma is widely used for surface treatment of objects to be processed (e.g., a substrate or the like).

Pulsed corona discharge and dielectric film discharge are well known as techniques of generating plasma. Pulsed corona discharge is a technique that uses a high-voltage pulse power supply to generate plasma, and dielectric film discharge is a technique in which a dielectric is formed on at least one of two electrodes and a power having a frequency of several Hz to several tens of Hz is applied to the two electrodes to generate plasma.

A dielectric barrier discharge (DBD) technique is employed as the representative dielectric film discharge. In a plasma processing apparatus using the DBD technique, when an object to be processed is disposed between plate electrodes and an inert gas is used to cause the dielectric film discharge to occur, plasma is generated and then brought into contact with a surface of the object to be processed, thereby processing the surface of the object to be processed.

However, in the plasma processing apparatus described above, since the object to be processed is disposed between the plate electrodes, although it is not difficult to process one surface or both surfaces when the object to be processed is a plate-like member, it is difficult to process an entire surface of the object to be processed when the object to be processed is a powder. A plasma processing apparatus for processing the object to be processed is thus required when the object to be processed is a powder.

A plasma processing apparatus of the prior art for processing an object to be processed when the object to be processed is a powder is disclosed in an application filed with the title "Tubular plasma processing apparatus" as Korean application No. 10-2012-0078234 by the present inventors. According to this literature, it is possible to perform surface treatment on a powder but difficult to perform uniform processing on the powder.

The present inventors have recognized the problems of the prior art and solved the problems of the conventional plasma processing apparatus through research. Further, the present inventors have developed a powder plasma processing apparatus that can provide a method of controlling a contact time between an object to be processed and plasma and efficiently performing uniform processing on a powder.

SUMMARY OF THE INVENTION

The present invention is directed to a powder plasma processing apparatus, which includes: a chamber configured to perform plasma processing on a powder; a powder supply unit disposed in an upper portion of the chamber; and a plurality of plate-like surface discharge plasma modules disposed below the powder supply unit and positioned within the chamber, wherein surfaces of the surface discharge plasma modules are spaced apart from each other.

In this case, each surface of the surface discharge plasma module is not perpendicular to a direction in which the powder is supplied. For example, an upper portion of the surface discharge plasma module is positioned below the powder supply unit, a lower portion of the surface discharge plasma module is positioned in a direction inclined toward one side from the upper portion, and the powder supplied through the powder supply unit falls down in the inclined direction of the surface discharge plasma module inclined toward the one side.

According to an embodiment of the present invention, the surface discharge plasma module includes a high-voltage-applying electrode to which a high voltage is applied, an insulating layer surrounding the high-voltage-applying electrode, and a ground electrode disposed on the insulating layer. An alternating voltage is applied to the ground electrode and the high-voltage-applying electrode to generate the plasma around the ground electrode, and the powder is processed as it passes through the plasma.

The high-voltage-applying electrode is in the form of a substrate, the ground electrode is in the form of a bar, and a plurality of the ground electrodes are positioned in parallel with each other. The ground electrodes are disposed in parallel with the direction in which the powder falls along the surface discharge plasma module. The powder is guided to fall down.

According to another embodiment of the present invention, the surface discharge plasma module includes an insulating layer, a high-voltage-applying electrode to which a high voltage is applied and which is disposed on one surface of the insulating layer, and a ground electrode disposed on the other surface of the insulating layer, wherein an alternating voltage is applied to the ground electrode or the high-voltage-applying electrode to generate the plasma around the ground electrode or the high-voltage-applying electrode, and the powder is are by as it passes through the plasma.

The ground electrode and the high-voltage-applying electrode are in the form of a bar, and a cross-sectional shape of the surface discharge plasma module is such that the ground electrode and the high-voltage-applying electrode are alternately disposed on respective positions.

According to yet another embodiment of the present invention, the ground electrode is in the form of a bar and the high-voltage-applying electrode is in the form of a substrate, or the ground electrode is in the form of a substrate and the high-voltage-applying electrodes is in the form of a bar.

In the embodiments described above, the same electrodes of the surface discharge plasma modules are disposed to face each other within the chamber.

The apparatus includes an inclination adjusting unit configured to adjust an angle of inclination of the surface discharge plasma module to a predetermined angle within the chamber. The specific method in which the angle of inclination of the surface discharge plasma module is adjusted is not a characteristic of the present invention, and it will be recognized that various methods for adjusting the angle of inclination of the surface discharge plasma module may be employed for the present invention.

According to the powder plasma processing apparatus of the present invention, it is possible to perform uniform processing on the powder and to control the time the powder spends in contact with the plasma, thereby allowing efficient powder processing to be performed.

BRIEF DESCRIPTION OF THE DRAWINGS

The above and other objects, features and advantages of the present invention will become more apparent to those of ordinary skill in the art by describing in detail exemplary embodiments thereof with reference to the accompanying drawings, in which:

FIG. 1 is a cross-sectional diagram illustrating a configuration of a powder plasma processing apparatus according to an embodiment of the present invention;

FIG. 2 is a perspective view of the surface discharge plasma module shown in FIG. 1;

FIG. 3 is a cross-sectional diagram taken along the line A-A' of the surface discharge plasma module shown in FIG. 1;

FIG. 4 is a cross-sectional diagram illustrating a surface discharge plasma module according to another embodiment of the present invention;

FIG. 5 is a cross-sectional diagram illustrating an arrangement of the surface discharge plasma module shown in FIG. 4;

FIGS. 6A and 6B are cross-sectional diagrams illustrating the surface discharge plasma module according to yet another embodiment of the present invention; and FIG. 7 is a cross-sectional diagram illustrating an arrangement of the surface discharge plasma module shown in FIGS. 6A and 6B.

DETAILED DESCRIPTION OF EXEMPLARY EMBODIMENTS

A powder plasma processing apparatus according to embodiments of the present invention will be described in detail below with reference to the accompanying drawings. The present invention may be subjected to many changes and have several forms, and specific embodiments thereof are illustrated in the drawings and described in detail in the specification. However, it will be understood that the present invention is not intended to be limited to the specific forms set forth herein, and all changes, equivalents, and substitutions included in the technical scope and spirit of the present invention are included. Referring to the drawings, similar reference numerals are used to refer to similar components. In the accompanying drawings, the dimensions of the structures may be exaggerated for clarity.

Terms such as first, second, and the like may be used to describe various components, but these components should not be limited by the terms. The terms are used only for the purpose of distinguishing one component from another component. For instance, a first component may be referred to as a second component, or similarly, a second component may be referred to as a first component, without departing from the scope of the present invention.

Terms used herein are intended to only explain specific embodiments of the present invention, not to limit the invention. The singular forms "a," "an" and "the" are intended to include the plural forms as well, unless the context clearly indicates otherwise. It will be understood that the terms "comprises" or "have," when used in this specification, are intended to specify the presence of stated features, integers, steps, operations, components, a combination thereof, but do not preclude the presence or addition of one or more other features, integers, steps, operations, components, or a combination thereof.

Unless otherwise defined herein, all terms used in the present invention including technical or scientific terms have the same meanings as terms that are generally understood by those skilled in the art related to the field of the present invention. The same terms as those that are defined in a general dictionary should be understood to have the same meanings as contextual meanings of the related art. Unless the terms are explicitly defined in the present invention, the terms should not be interpreted with ideal or excessively formal meanings.

FIG. 1 is a cross-sectional diagram illustrating a configuration of a powder plasma processing apparatus according to an embodiment of the present invention.

Referring to FIG. 1, the powder plasma processing apparatus according to the embodiment of the present invention may include a chamber 110, a powder supply unit 111, and surface discharge plasma modules 120.

The chamber 110 provides the surface discharge plasma modules 120 and an internal space for a plasma reaction with a plasma reaction gas, and protects the internal space of the chamber from the outside. A powder collection unit is disposed in a lower portion of the chamber 110. For example, the powder collection unit may be disposed in a form in which it penetrates the lower portion of the chamber to be in direct communication with the outside. This type of powder collection unit is merely illustrative, and the powder collection unit is not limited to this type but may be provided in various forms. For example, the chamber 110 may be formed of an insulating material such as a heat-resisting glass or quartz.

The powder supply unit 111 is disposed in an upper portion of the chamber 110. For example, the powder supply unit 111 may be an input entrance allowing a powder to be input into the chamber 110.

The surface discharge plasma module 120 generates the plasma for performing surface treatment on the powder. The surface discharge plasma module 120 is tubular and is disposed inside the chamber 110. In this case, the surface discharge plasma module 120 is positioned below the powder supply unit 111. Accordingly, the powder input into the chamber 110 through the powder supply unit 111 falls toward the surface discharge plasma module 120.

A plurality of the surface discharge plasma modules 120 are arranged to be positioned in the internal space of the chamber 110. Surfaces of the surface discharge plasma modules 120 face each other, and the surfaces of the surface discharge plasma modules 120 facing each other are spaced apart from each other.

The arrangement of the surface discharge plasma modules 120 described above causes the powder input into the chamber 110 through the powder supply unit 111 to fall between the surface discharge plasma modules 120. In this case, the powder input through the powder supply unit 111 is dispersed between the surface discharge plasma modules

120. The dispersed powder is thus in contact with the plasma and the surface treatment can be uniformly performed.

The surface discharge plasma modules 120 are disposed such that they are not perpendicular to the powder supply direction within the chamber 110. For example, an upper portion of each of the surface discharge plasma modules 120 may be positioned below the powder supply unit 111 and a lower portion thereof may be positioned in an inclined direction toward one side from the upper portion. In other words, the surface discharge plasma modules 120 are dispersed to be inclined toward the one side below the powder supply unit 111.

The surface discharge plasma modules 120 should be disposed such that they are not perpendicular to the powder supply direction as mentioned above. This is for the following reason. When the surface discharge plasma modules 120 are disposed perpendicular to the power supply direction, the powder supplied into the chamber 110 through the powder supply unit 111 is not in contact with each surface discharge plasma module 120 and falls down fast vertically when input into the chamber 110, thereby shortening the time that the powder spends in contact with the plasma and causing difficulty in the surface treatment for the powder.

On the other hand, when the surface discharge plasma modules 120 are not disposed perpendicular to the power supply direction, the powder supplied into the chamber 110 through the powder supply unit 111 falls onto the upper portions of the surface discharge plasma modules 120 and then slides along the surfaces of the surface discharge plasma modules 120 toward the lower portion of the chamber 110, thereby lengthening the time the powder spends in contact with the plasma and simplifying the surface treatment for the powder.

FIG. 2 is a perspective view illustrating the surface discharge plasma module shown in FIG. 1, and FIG. 3 is a cross-sectional diagram taken along the line A-A' of the surface discharge plasma module shown in FIG. 2.

Referring to FIGS. 2 and 3, each of the surface discharge plasma modules 120 includes a high-voltage-applying electrode 121 to which a high voltage is applied, an insulating layer 122 surrounding the high voltage applying electrode, and a plurality of ground electrodes 123 disposed on the insulating layer 122.

The high-voltage-applying electrode 121 is electrically insulated within the chamber 110 by the insulating layer 122. For example, the high-voltage-applying electrode 121 may be in the form of a substrate.

For example, the ground electrodes 123 may be in the form of a bar, may be positioned in parallel with each other on the insulating layer 122, and may be disposed in a direction in parallel with the direction in which the powder falls along the surface discharge plasma module 120. In other words, the longitudinal direction of the ground electrodes 123 is in parallel with the falling direction of the powder to guide the powder to fall down, and the ground electrodes 123 are arranged to be adjacent to each other at regular intervals on the insulating layer 122.

In this surface discharge plasma module 120, an alternating voltage is applied from a plasma power supply 130 provided outside the chamber 110 to the ground electrodes 123 and the high-voltage-applying electrode 121, thereby generating the plasma around the ground electrodes 123.

In order to generate the plasma around the ground electrodes 123, a plasma reaction gas is injected into the chamber 110 toward the ground electrodes 123. The plasma reaction gas injected into the chamber 110 flows between the surface discharge plasma modules 120. For example, a gas containing oxygen such as $O_2$, $N_2O$, a gas containing fluorine such as $CF_4$, $SF_6$, a gas containing chlorine such as $Cl_2$, $BCl_3$, and an inert gas such as Ar, $N_2$ may be used alone or in combination as the plasma reaction gas.

In order to inject the plasma reaction gas, the chamber 110 includes a gas inlet and a gas outlet.

In the meantime, the apparatus of the present invention includes a plasma module inclination adjusting unit (not shown). The plasma module inclination adjusting unit is configured to adjust the angle of inclination of the surface discharge plasma module within the chamber. When the inclination angle between the surface discharge plasma modules is adjusted, the speed at which the powder falls down is adjusted. When the speed at which the powder falls down is adjusted, the time that the powder spends in contact with the plasma is controlled.

According to the powder plasma processing apparatus of the embodiment of the present invention, the powder input into the chamber 110 is dispersed and falls between the surface discharge plasma modules 120 of which surfaces are spaced apart from each other, the surface discharge plasma modules 120 are disposed at a predetermined angle below the powder supply unit 111, and the inclination angle of the surface discharge plasma module 120 is adjusted. The powder can thus be uniformly processed, and the time that the powder spends in contact with the plasma is controlled to increase the contact time between the plasma and the powder, thereby facilitating the surface treatment for the powder.

FIG. 4 is a cross-sectional diagram illustrating a surface discharge plasma module according to another embodiment of the present invention, and FIG. 5 is a cross-sectional diagram illustrating the arrangement of the surface discharge plasma module shown in FIG. 4

Referring to FIG. 4, the surface discharge plasma module 220 according to the embodiment of the present invention is configured to have an insulating layer 222 disposed in the middle of the surface discharge plasma module 220, high-voltage-applying electrodes 221 disposed on one surface of the insulating layer 222, and ground electrodes 223 disposed on the other surface of the insulating layer 222. The shape of the high-voltage-applying electrodes 221 and the ground electrodes 223 is a bar shape. The arrangement of the high-voltage-applying electrodes 221 and the ground electrodes 223 is such that the high-voltage-applying electrodes 221 and the ground electrodes 223 are alternately disposed on the respective positions when seen from the cross section of the surface discharge plasma module 220.

When the surface discharge plasma module 220 according to the embodiment of the present invention is disposed within the chamber, the same electrodes are disposed to face each other as shown in FIG. 5. However, the present invention is not limited thereto, and different electrodes may be disposed to face each other, or two modules in which the same electrodes are disposed to face each other and two modules in which the different electrodes are disposed to face each other may be repeatedly arranged.

In the surface discharge plasma module 220 having the arrangement described above, the plasma is generated around the high-voltage-applying electrodes 221 or the ground electrodes 223.

FIGS. 6A and 6B are cross-sectional diagrams illustrating the face discharge plasma module according to yet another embodiment of the present invention, and FIG. 7 is a cross-sectional diagram illustrating the arrangement of the surface discharge plasma module shown in FIGS. 6A and 6B.

The arrangement of each of an insulating layer 322, high-voltage-applying electrodes 321, and ground electrodes 323 of the surface discharge plasma module 320 according to the embodiment of the present invention is the same as or similar to that of the surface discharge plasma module 220 shown in FIG. 4, but is different in the shapes of the high-voltage-applying electrodes 321 and the ground electrodes 323.

The shapes of the high-voltage-applying electrodes 321 and the ground electrodes 323 of the surface discharge plasma module 320 according to the embodiment of the present invention are as Follows. For example, the high-voltage-applying electrodes 321 may be in the form of a substrate and the ground electrodes 3:23 may be in the form of a bar as shown in FIG. 6A. As another example, the high-voltage-applying electrodes 321 may be in the form of a bar and the ground electrodes 323 may be in the form of a substrate as shown in FIG. 6B.

When the surface discharge plasma module 320 according to the embodiment of the present invention is disposed within the chamber, the same electrodes are disposed to face each other as shown in FIG. 7. However, the present invention is not limited thereto, and the different electrodes may be disposed to face each other, or two modules in which the same electrodes are disposed to face each other and two modules in which the different electrodes are disposed to face each other may be repeatedly arranged.

In the surface discharge plasma module 320 having the arrangement described above, the plasma is generated around the high-voltage-applying electrodes 321 or the ground electrodes 323.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

REFERENCE NUMERAL

110 Chamber
111 Powder supply unit
112 Gas inlet
113 Gas outlet
120 Surface discharge plasma module
121 High-voltage-applying electrode
122 Insulating layer
123 Ground electrode
130 Plasma power supply

What is claimed is:

1. A method of processing a powder using a powder surface processing apparatus of a plate-like surface discharge plasma module:
the apparatus comprising:
a chamber configured to perform plasma processing on a powder; and
a plate-like surface discharge plasma module disposed in the chamber,
wherein the plate-like surface discharge module comprises:
an insulating layer;
a plate-like electrode layer which is disposed on one side of the insulating layer; and
a plurality of plasma generating electrodes in the form of a bar which are disposed on the other side of the insulating layer at intervals,
wherein the plate-like surface discharge plasma module is configured to apply an alternating voltage to the plurality of plasma generating electrodes and the plate-like electrode layer to generate plasma around the plurality of plasma generating electrodes, and the plate-like surface discharge plasma module is configured to position a powder on the plasma generating electrodes and treat the surface of the powder by the generated plasma,
the method comprising:
generating a plasma with the plasma generating electrodes of the powder surface processing apparatus; and
contacting a powder with the plasma generated from the plate-like plasma generating electrodes and treating the surface of the powder.

2. The method of claim 1, wherein the plasma is generated from a plasma reaction gas injected into the surface discharge plasma module.

3. The method of claim 2, wherein the plasma reaction gas comprises an inert gas and a gas containing oxygen, fluorine, or chlorine.

4. The method of claim 3, wherein the inert gas comprises Ar or $N_2$.

5. The method of claim 3, wherein the gas containing oxygen comprises $O_2$ or $N_2O$.

6. The method of claim 3, wherein the gas containing fluorine comprises $CF_4$ or $SF_6$.

7. The method of claim 3, wherein the gas containing chlorine comprises $Cl_2$ or $BCl_3$.

8. The method of claim 1, wherein a high voltage is applied to the plate-like electrode layer, and the plurality of plasma generating electrodes are ground electrodes.

9. The method of claim 8, wherein the apparatus comprises at least two of the plate-like surface discharge modules, the ground electrode or the high-voltage-applying electrodes in each module are disposed to face each other within the chamber.

10. The method of claim 1, wherein a high voltage is applied to the plurality of plasma generating electrodes, and the plate-like electrode layer is a ground electrode.

11. The method of claim 10, wherein the apparatus comprises at least two of the plate-like surface discharge modules, the ground electrode or the high-voltage-applying electrodes in each module are disposed to face each other within the chamber.

12. The method of claim 1, wherein the apparatus comprises a powder supply unit disposed in an upper portion of the chamber, wherein the plate-like surface discharge plasma module is disposed below the powder supply unit and positioned within the chamber, wherein the surface of the plate-like surface discharge plasma module is not perpendicular to a direction in which the powder is supplied.

13. The method of claim 12, further comprising an inclination adjusting unit configured to adjust an angle of inclination of the plate-like surface discharge plasma module to a predetermined angle within the chamber.

14. The method of claim 12, wherein an upper portion of the plate-like surface discharge plasma module is positioned below the powder supply unit, a lower portion of the plate-like surface discharge plasma module is positioned in a direction inclined toward one side from the upper portion, and the powder supplied through the powder supply unit falls down in the inclined direction of the plate-like surface discharge plasma module inclined toward the one side.

15. The method of claim 12, wherein the plurality of plasma generating electrodes are disposed in parallel with a direction in which the powder falls along the plate-like surface discharge plasma module to guide the powder to fall down.

* * * * *